United States Patent [19]

Gosselin et al.

[11] Patent Number: 4,563,596
[45] Date of Patent: Jan. 7, 1986

[54] PROCESS AND CIRCUIT FOR CONTROLLING THE BASE DRIVE OF A POWER TRANSISTOR

[76] Inventors: Olivier L. Gosselin, Ave. de la Porte de Sèvres, 75 015 Paris; Maxime Dessoude, 15 Ave. Francois Begué, 93 240 Stains, both of France

[21] Appl. No.: 563,452

[22] Filed: Dec. 20, 1983

[30] Foreign Application Priority Data

Dec. 22, 1982 [FR] France ................... 82 21528

[51] Int. Cl.[4] ............... H03K 17/06; H03K 17/60
[52] U.S. Cl. ................... 307/297; 307/253; 307/299 R; 307/360
[58] Field of Search .......... 307/228, 270, 297, 360, 307/491, 552, 553, 253, 299 R; 323/279, 280, 281, 284, 289

[56] References Cited

U.S. PATENT DOCUMENTS 4,055,794 10/1977 Ickes et al. .................. 323/289

FOREIGN PATENT DOCUMENTS 2534093 4/1984 France .

Primary Examiner—William H. Beha, Jr.
Assistant Examiner—Jeffrey Sterrett
Attorney, Agent, or Firm—Larson and Taylor

[57] ABSTRACT

The derivative of the collector-emitter potential of a transistor (T) relative to the base current is detected preferably by effecting a linear sweep of the base current, the value of this derivative is compared in a comparator stage (5) with a lower limit value and an upper limit value determining an optimum operation zone of the transistor in the vicinity of its quasi-saturation, and the base current is controlled by the result of the comparison. A high gain and an optimum operation of the power transistor (T) are achieved.

13 Claims, 5 Drawing Figures

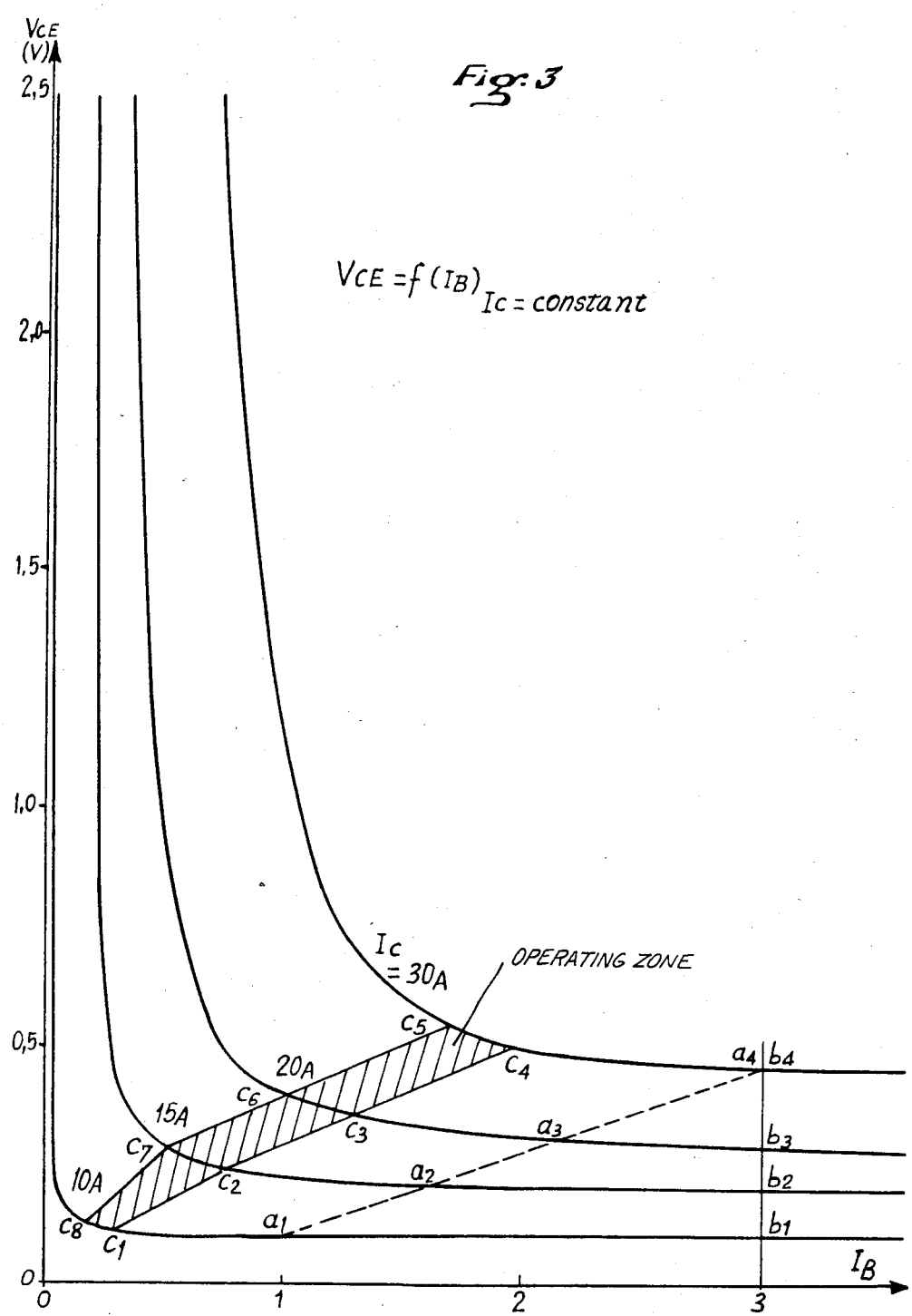

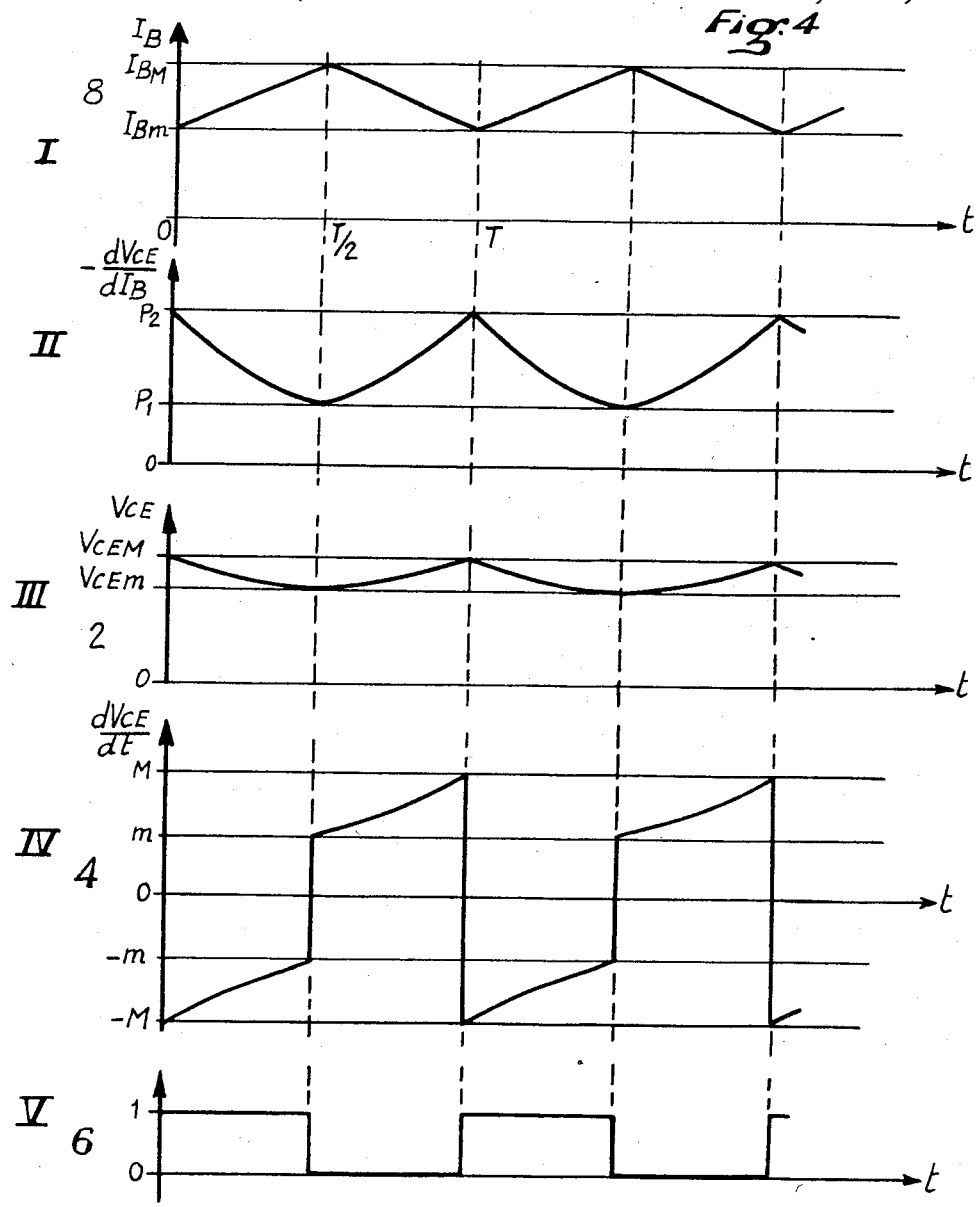

PROCESS AND CIRCUIT FOR CONTROLLING THE BASE DRIVE OF A POWER TRANSISTOR

The present invention relates to a process for controlling a power transistor adapted to cause it to operate in its optimum operating zone. The invention also relates to a circuit for carrying out said process.

Generally, the controls of the base drive of power transistors, for example transistors controlling a supply for a motor, a periodically actuated device etc., employ a fixed base current, of sufficient magnitude to permit the control of the transistor, bearing in mind possible variations in the collector current. These controls correspond to a gain of the order of 10 considered for the maximum collector current.

This gain is generally considered to be satisfactory. However, if the collector current varies to a great extent, or if the temperature of the power transistor is liable to vary, these controls become much less satisfactory and then correspond to reduced gains.

An object of the present invention is to overcome drawbacks and to provide a process for controlling a power transistor which allows large variations in the collector current and temperature while retaining a high gain in all the operating circumstances.

Another object of the invention is to provide such a process which permits a substantial rise in the gain.

Still another object of the invention is to provide such a process which may be adapted to control circuits which consume only a minimum amount of energy and give off only a small amount of heat.

A further object of the invention is to provide circuits for carrying out said process.

The invention provides a process for controlling the base drive of a power transistor, comprising detecting the derivative of the collector-emitter potential of the power transistor relative to the base current of said transistor and controlling the base current in such manner as to maintain the value of the derivative between two limits, namely an upper limit and a lower limit, which are so chosen as to define an optimum operating zone of the transistor.

The optimum operating zone of the transistor is considered to be that in which the base current is minimum while maintaining the collector-emitter potential at a low level. If curves are drawn which show the variation of the collector-emitter potential as a function of the base current for a given collector current, this optimum operation zone is in the vicinity of the point of the largest curvature of these curves.

In a preferred manner of carrying out the invention, the base current may be varied in a continuous manner so as to produce a corresponding variation of the collector-emitter potential which is measured, and from which the derivative with respect to time is derived. In the interests of simplification, it is preferred to obtain the variation of the base current by a time base sweep so as to increase and then decrease alternately the base current, preferably in a linear or substantially linear manner.

In this way there is no need to measure the base current itself, since the variation of this current with respect to time is known.

Preferably, the value of the derivative is detected in an analog manner by obtaining an image of this derivative, comparing this derivative with said lower and higher values, and controlling the value of the base current as a function of said comparison, these operations being carried out while preferably maintaining a sweep of the base current as mentioned before. Thus, if a linear sweep of the base current is produced, it is sufficient to produce an electric image of the derivative of the collector-emitter potential which gives, apart from a constant, the image of the derivative.

Thus the collector-emitter potential can be derived in a differentiator stage, this derivative can be compared in a comparator stage and then the results of the comparison can be integrated so as to produce the sweep slope of the base current.

However, the process may also be carried out in a digital manner. In this case, the process comprises effecting a step-by-step exploration of the collector-emitter potential as a function of the base current derived, the derivative for each of the measuring points, comparing the result of the calculation with pre-established lower and higher values and controlling the base drive current in a corresponding manner.

By means of the invention, it is easy to obtain current gains between 15 and 20 for a quite suitable saturation voltage. Further, the fact that the transistor operates close to its quasi-saturation zone, facilitates turning on the transistor owing to the fact that the charges stored in the base are minimum.

The invention also provides a circuit for carrying out said process and comprising means for detecting the derivative of the collector-emitter potential of the transistor relative to the base drive current of the latter, means for comparing the detected values with given lower and upper values, and means for controlling the base drive current so as to maintain the value of the derivative within said limits.

Said means may be, totally or partly, of the digital type, but means of the analog type are preferred to be employed.

Preferably, the device comprises base current sweep means so as to vary constantly the collector-emitter potential for the purpose of deriving said potential with respect to time, said sweep means being preferably arranged to effect a linear or quasi-linear sweep.

The means for detecting the derivative of the collector-emitter potential are differentiating means which permit the detection of the derivative of said potential with respect to time.

Thus the circuit may advantageously comprise a differentiator stage responsive to the collector-emitter potential and preferably having a differential amplifier followed by the differentiator proper, then a comparator stage for comparing the value of the derivative obtained with two lower and upper limit values, the comparator stage advantageously and optionally including a double comparator, and current regulating means including an integrator responsive to the result of the comparison for generating an alternately rising and descending slope by acting on a suitable source of current.

The switch and the source of current may, if desired, be replaced by a current chopper circuit.

In another embodiment, the integrator or slope generator and the source of current may be replaced by a base control of the type described in French Pat. No. 2,534,093. Such a device generates an alternately increasing and decreasing control current which is non-linear so that this must be taken into account in the determination of the maximum and minimum limits by correcting them with coefficients.

Further features and advantages of the invention will be apparent from the following description given by way of a non-limiting example with reference to the accompanying drawings in which:

FIG. 3 is a view of the characteristic curves $V_{CE}/I_B$.

FIG. 4 represents the form of the electric signals at different points of the circuit.

FIG. 5 represents a circuit according to an improved form of the invention.

Figure 1:
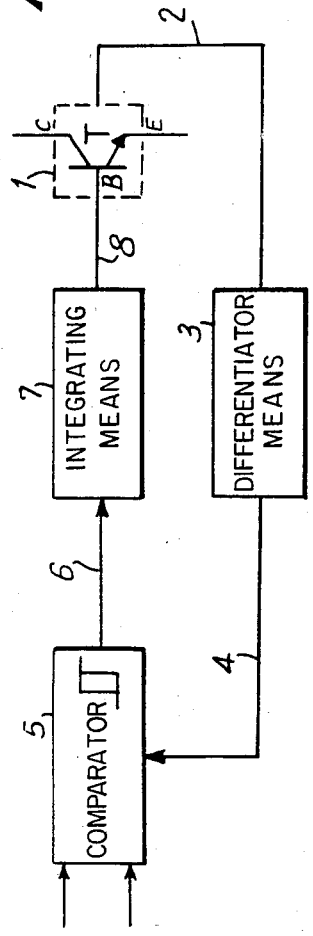
FIG. 1 is a block diagram of a circuit according to the invention.

Reference will be made first of all to FIG. 3.

FIG. 3 shows a graph having as abscissae the base currents $I_B$. of a power transistor, for example of the type BUX 20, in amperes and, as ordinates, the collector-emitter potentials $V_{CE}$ in volts. The various curves shown correspond to constant collector currents $I_C$. More precisely, there have been shown the four curves $I_B=f(V_{CE})$ in which $I_C=30$ amperes, 20 amperes, 15 amperes and 10 amperes.

When the power transistor operates in the conventional manner with a base current $I_B$ which is constant and is of the order of 3 amperes for a transistor, it is found that the performances, which are moderate for a collector current of 30 amperes, become very low for a collector current of 10 amperes. The corresponding points on the curves in FIG. 3 are shown by the references b1, b2, b3 and b4.

If the transistor operates in an improved but conventional manner with a constant gain, the operating points are this time located on the straight line through the points a1, a2, a3 and a4=b4. Better performances are obtained in this case since the base current decreases when the collector current $I_C$ decreases. However, even in this case of operation, the transistor remains far from its optimum saturation zone.

This is why, in accordance with the invention, it is desired to operate in an optimum operation zone whose lower current limit is defined by the points c5, c6, c7, c8, i.e. the points where the curve $I_C=$ constant, has a (negative) tangent slope having the same value for each of the points c5 to c8 and a limit absolute value beyond which it is considered that the increase in potential corresponding a reduction in current becomes excessive, while the upper current limit is defined by the points c1, c2, c3, c4 all of which have the same (negative) tangent slope whose absolute value is lower than that of the aforementioned points c5 to c8, the line c1, c2, c3, c4 being chosen rather close to the line c5, c6, c7, c8 so as to operate in a small operating zone, it being understood, on the other hand, that the difference between the tangent slopes at the points such as c4 and c5 must be sufficient to enable the two corresponding lower and upper limit values to be sufficiently different for the operation of a circuit according to the invention. In practice, the current range of the zone, i.e. the difference between the abscissae of the couples of points c1–c8, c2–c7, . . . c4–c5, may be for example between 0.1 and 0.3 ampere.

According to the invention, the process for controlling the base drive of a power transistor comprises comparing within the optimum operation zone crosshatched in FIG. 3, the derived value of the derivative:

$$\frac{dV_{CE}}{dI_B}$$

which is shown on the graph (FIG. 3) by the slope of the tangent at the considered point on the curve $I_C$ in operation, with values of the slopes of the tangents on the lines c1 to c4 and c5 to c8, the results of the comparison being employed for controlling the base drive current $I_B$ in such manner that the point of operation remains constantly within said zone.

FIG. 1 shows a block diagram of a circuit according to the invention in which can be seen the power transistor T with its base B, its collector C and its emitter E, the perimeter or box 1 shown in dashed lines containing the transistor including means for detecting the instantaneous value $V_{CE}$ sent by a line 2 to differentiating means 3 so as to obtain on the output line 4, the derivative of the collector-emitter potential relative to the base current, this instantaneous value being sent to comparison means 5 in which are inserted the value of the upper limit (slope of the tangents at the points c5, c6, c7 or c8) and the lower limit value corresponding to the slope or tangent at the points c1, c2, c3 or c4. The result of the comparison is sent through a line 6 to a sweep circuit 7 which produces an alternately increasing and decreasing sweep of the current $I_B$, this current $I_B$ being sent through the line 8 to the base B of the transistor T.

Thus, in assuming that the collector current $I_C$ is constant, the current $I_B$ very slightly varies on each side of the mean value corresponding to this collector current for the potential $V_{CE}$ controlled between the values such as c1, c8 etc. corresponding to the curve $I_C$ in question.

If the collector current $I_C$ varied for some reason, the device according to the invention, in detecting a variation of slope, will react and maintain the current $I_B$ and consequently the potential $V_{CE}$ within the optimum operation zone.

The construction of the differentiating means 3 for obtaining the value of the derivative $$\frac{dV_{CE}}{dI_B}$$

may be, depending on the design, relatively complex and may require a passage through a digital channel which is necessarily rather slow.

Consequently, it is preferred to derive simply $V_{CE}$ with respect to time, which may be effected by conventional differentiating means with a linear sweep.

Indeed, in this case:

$$\frac{dV_{CE}}{dt} = \frac{dV_{CE}}{dI_B} \cdot \frac{dI_B}{dt} = k\frac{dV_{C2}}{dI_B}$$

where k is a constant.

Figure 2:
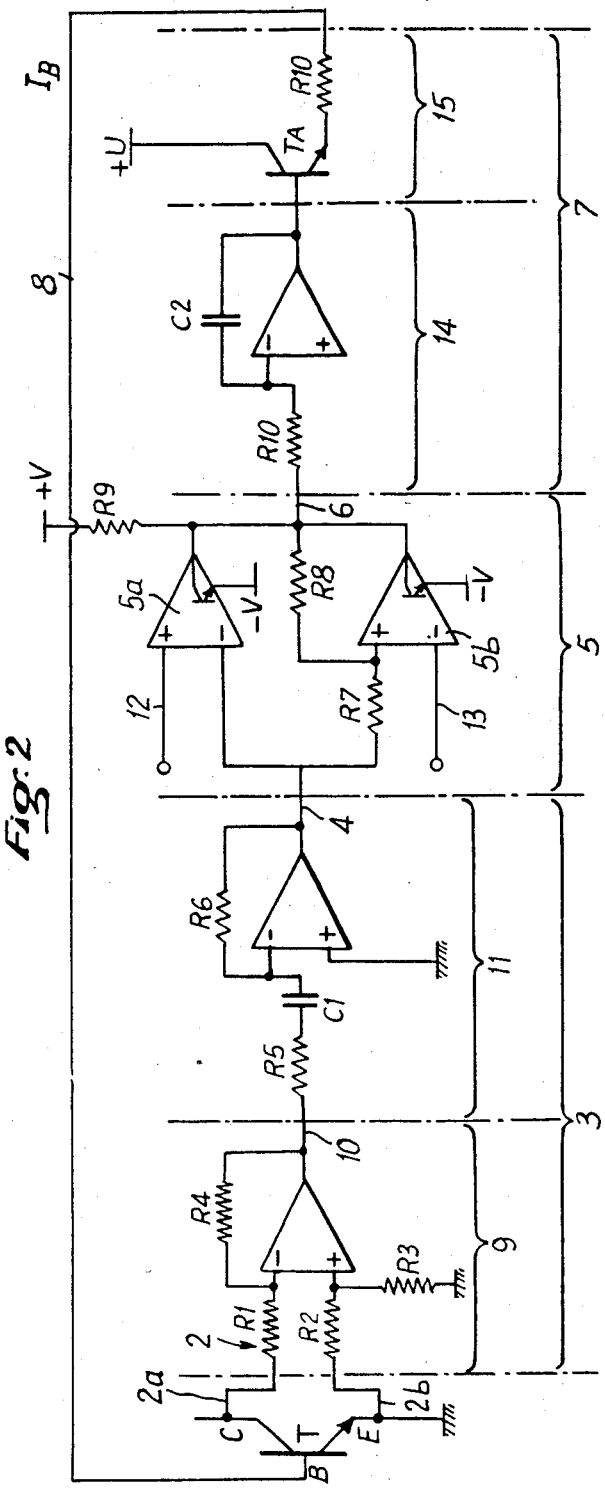
FIG. 2 is a diagram of such a circuit.

With reference to FIGS. 1 and 2, there is shown a circuit according to the invention constructed in this way in an analog manner.

The voltage $V_{CE}$ is detected by the conductors 2a, 2b and sent to a differential amplifier 9 including an amplifier proper and its circuitry of resistors R1, R2, R3 and R4. The output 10 of the differential amplifier is connected to the differentiator proper 11, the unit 9 and 11 forming the differentiator means 3. The unit 11 is a conventional differentiator with its amplifier, its capacitor $C_1$ and its resistors $R_5$ and $R_6$. The output 4 of the differentiator is connected to the comparator stage 5 which includes the comparators 5a, 5b connected in parallel and in an opposed manner, the comparator 5 permitting the comparison of the signal sent through the line 4 with the upper limit inserted at 12 while the comparator 5b compares the signal sent through the line 4 with the lower limit inserted at 13. The insertion of the limits may be advantageously effected by adjustable potentiometers which permit an easy adjustment and an easy multiplication of the values of the limits.

The output 6 of the comparator is connected to a conventional integrator with its amplifier, its resistor $R_{10}$ and its capacitor $C_2$. The integrator 14 thus formed acts on the base of a control transistor TA of a source of current $+V$ in unit 15 and generates, in the output conductor 8, a current $I_B$ having a sloping shape whose increasing or decreasing direction depends on the sign of the comparison effected in the stage 5. It will be understood that, when this current has varied in such manner that one of the limit values is reached, the actuation of the comparator 5 reverses the increasing slope.

FIG. 4 shows the following graphs:
Graph I: curve $I_B$ on the conductor 8;
Graph II: curve;

$$-\frac{dV_{CE}}{dI_B}$$

Graph III: the shape of $V_{CE}$ on the detecting conductors 2a and 2b;
Graph IV:

$$\frac{dV_{CE}}{dt}$$

as a function of the circuit;
Graph V: sweep control detected on the conductor 6.

It can be seen that, for a well-determined collector current $I_C$ on the graph III, $V_{CE}$ varies between its maximum value $V_{CEM}$ and its minimum value $V_{CEm}$ in a non-linear manner in alternating between increasing and decreasing zones.

Owing to the linear variation of the current $I_B$ brought about by the circuit, the derivative shown on the graph II may be replaced by the derivative issuing from the differentiator II and shown graphically in the graph IV.

Graph V shows the result of the comparison which, owing to the integrator 14, controls the shape of the base current $I_B$ in a linear manner and alternately increasing and decreasing between the maximum value $I_{BM}$ and minimum value $I_{BM}$ corresponding to the values $V_{CEM}$ and $V_{CEm}$ of the collector-emitter potential.

It will moreover be understood that, if the collector current $I_C$ changes, the operation will continue except that, during the variation of the current $I_C$ which is usually very rapid, the sweep will be continued in the direction opposed to this variation.

With reference now to FIG. 5, in this embodiment, the circuit of FIG. 2 no longer has a slope generator 7 which is replaced by a circuit such as that disclosed in the aforementioned French Pat. No. 2,534,093.

The transistor T is shown for supplying current to a load M at a supply voltage of $+W$. The output 6 of the comparator 5 is connected to an auxiliary control transistor T1 connected, on one hand, to the supply line $+W$ and, on the other hand, to the input of an induction coil L whose output is connected, through a resistor R, to the base B of the power transistor T. A diode D is also connected, in opposition, to the common terminal of the transistor T1 and the coil L.

In this way, when the transistor T1 is turned on by the output 6 of the comparator 5, the current passing through the transistor T1 starts to increase in a substantially linear manner, the slope being determined by the value of the potential W and the value of the coil L and of the resistor R, this current being found on the base B. When, subsequent to the reversal of the direction of increase, the comparator 5 turns off the transistor T1, there is established a discharge current of the coil L through diode D and there is then obtained a progressive decrease of the current passing through the coil, i.e. of the current $I_B$. In other words, the base current $I_B$ of the transistor T then has a sawtooth shape whose peak values are determined by the hysteresis introduced by the presence of the coil L. This circuit therefore performs the function of a generator of a slope and of the source of current with particular advantages, namely an extremely low consumption of energy and an equally low amount of heat given off.

The values of the induction coil L and the resistor R may be so chosen as to obtain a sweep $I_B$ which is relatively close to a linear sweep. If the sweep is not linear, it is possible to employ this circuit by means of various artifices, for example by sufficiently modifying the lower and upper limit values or by disposing a suitable interface upstream of the differentiator 3.

Whatever be the chosen embodiment, it is usually preferred to arrange that the frequency of the device be equal to at least 1 kHz and preferably lower than 100 kHz. This frequency may be determined by the slope given to the integrator.

What is claimed is:

1. A process for controlling the base drive of a power transistor, comprising detecting the collect-emitter potential, deriving the derivative of said potential, using a comparator to compare said derivative to upper and lower limits, integrating the comparator output to produce an integrated signal and controlling the base drive with said integrated signal.

2. A process according to claim 1, wherein the value of the derivative is derived in an analog manner.

3. A process according to claim 1, comprising varying the base drive current of the power transistor so as to produce a corresponding variation of the collector-emitter potential.

4. A process according to claim 3, comprising deriving the derivative of the detected collector-emitter potential with respect to time.

5. A process according to claim 3, comprising effecting a time base sweep of the base current which alternately increases and decreases with respect to time.

6. A process according to claim 5, comprising effecting said sweep by employing a current hysteresis in an induction coil when integrating the comparator output.

7. A process according to claim 5, comprising effecting a linear sweep.

8. A process according to claim 7, comprising effecting said sweep by employing a current hysteresis in an induction coil when integrating the comparator output.

9. A circuit for controlling the base drive of a power transistor having a base, a collector and an emitter, said circuit comprising means for detecting the collector-emitter potential, differentiating means connected to said detecting means for deriving the derivative of said potential, a comparator circuit having means for inserting in said comparator circuit upper and lower current limits and connected to said differentiating means for comparing said derivative with said upper and lower limits, integrating means connected to said comparator circuit for integrating the output signal of said comparator circuit and connected to said base of said power transistor for controlling said base with the integrated signal.

10. A circuit according to claim 9, wherein said differentiating means comprise a differential amplifier responsive to the collector-emitter potential of said power transistor, a differentiator connected to the output of said differential amplifier and having an output connected to said comparator circuit, said comparator circuit comprising two comparators, one of which comparators is adapted to set said lower limit whereas the other of said comparators is adapted to set said upper limit, said comparator circuit having an output which is connected to control base current sweep means.

11. A circuit according to claim 9, wherein said integrating means includes a base current sweep means connected to said base of said power transistor.

12. A circuit according to claim 11, wherein said sweep means comprise an integrator generating a linear slope.

13. A circuit according to claim 11, wherein said sweep means comprise a circuit including an induction coil, an auxiliary transistor having a base connected to the output of said comparator circuit, a collector connected to the induction coil, which coil is connected to the base of said power transistor whose emitter is connected through a diode to a junction between said coil and said collector of the auxiliary transistor.

* * * * *